(12) United States Patent
Fedorov

(10) Patent No.: US 8,953,314 B1
(45) Date of Patent: Feb. 10, 2015

(54) PASSIVE HEAT SINK FOR DYNAMIC THERMAL MANAGEMENT OF HOT SPOTS

(75) Inventor: Andrei G. Fedorov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 923 days.

(21) Appl. No.: 13/102,314

(22) Filed: May 6, 2011

Related U.S. Application Data

(60) Provisional application No. 61/371,891, filed on Aug. 9, 2010.

(51) Int. Cl.
 *H05K 7/20* (2006.01)
(52) U.S. Cl.
 USPC ........... 361/689; 361/677; 361/705; 438/599; 257/707; 257/712
(58) Field of Classification Search
 CPC ............ H01L 23/4093; H01L 23/4006; H01L 23/467; H01L 23/3672; H01L 23/427; H01L 23/473; H01L 2023/405; H01L 2924/14; H01L 2924/01079; F28F 3/12
 USPC ........................ 361/676–678, 679.46–679.54, 361/688–722, 752, 760–761, 831
 See application file for complete search history.

(56) References Cited

U.S. PATENT DOCUMENTS

| | | | | | |
|---|---|---|---|---|---|
| 3,596,713 | A | * | 8/1971 | Katz | 165/104.13 |
| 3,800,190 | A | * | 3/1974 | Marek | 257/715 |
| 4,531,146 | A | * | 7/1985 | Cutchaw | 257/713 |
| 4,612,978 | A | * | 9/1986 | Cutchaw | 165/104.33 |
| 4,730,665 | A | * | 3/1988 | Cutchaw | 165/80.4 |
| 4,823,863 | A | * | 4/1989 | Nakajima et al. | 165/80.4 |
| 4,884,169 | A | * | 11/1989 | Cutchaw | 361/700 |
| 5,131,233 | A | * | 7/1992 | Cray et al. | 62/64 |
| 5,581,192 | A | * | 12/1996 | Shea et al. | 324/722 |
| 5,768,103 | A | * | 6/1998 | Kobrinetz et al. | 361/699 |
| 5,771,967 | A | * | 6/1998 | Hyman | 165/274 |
| 5,854,092 | A | * | 12/1998 | Root et al. | 438/106 |
| 5,943,211 | A | * | 8/1999 | Havey et al. | 361/699 |
| 6,070,656 | A | * | 6/2000 | Dickey | 165/104.26 |
| 6,120,130 | A | * | 9/2000 | Hirano et al. | 347/46 |
| 6,349,760 | B1 | * | 2/2002 | Budelman | 165/80.4 |
| 6,460,612 | B1 | * | 10/2002 | Sehmbey et al. | 165/96 |

(Continued)

OTHER PUBLICATIONS

Darhuber, Anton A., et al., "Principles of Microfluidic Actuation by Modulation of Surface Stresses," Annual Review of Fluid Mechanics, vol. 37, Jan. 2005, pp. 425-455.

(Continued)

*Primary Examiner* — Courtney Smith
(74) *Attorney, Agent, or Firm* — Withrow & Terranova, P.L.L.C.

(57) ABSTRACT

A fully-passive, dynamically configurable directed cooling system for a microelectronic device is disclosed. In general, movable pins are suspended within a cooling plenum between an active layer and a second layer of the microelectronic device. In one embodiment, the second layer is another active layer of the microelectronic device. The movable pins are formed of a material that has a surface tension that decreases as temperature increases such that, in response to a temperature gradient on the surface of the active layer, the movable pins move by capillary flow in the directions of decreasing temperature. By moving in the direction of decreasing temperature, the movable pins move away from hot spots on the surface of the active layer, thereby opening a pathway for preferential flow of a coolant through the cooling plenum at a higher flow rate towards the hot spots.

35 Claims, 6 Drawing Sheets

(56) References Cited

U.S. PATENT DOCUMENTS

Figure 1A:
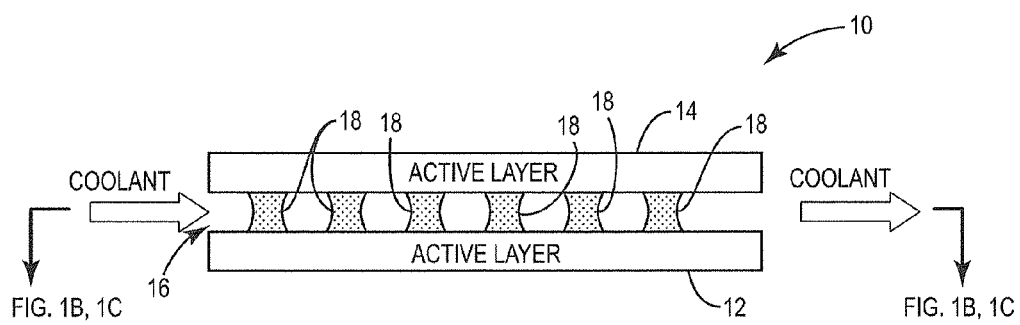

| | | | |
|---|---|---|---|
| 6,525,642 B1* | 2/2003 | Kremers et al. | 338/80 |
| 6,600,405 B1* | 7/2003 | Kremers et al. | 337/21 |
| 6,603,384 B1* | 8/2003 | Kremers et al. | 337/21 |
| 6,621,401 B1* | 9/2003 | Kremers et al. | 337/21 |
| 6,684,940 B1* | 2/2004 | Chao et al. | 165/104.21 |
| 6,827,134 B1* | 12/2004 | Rightley et al. | 165/104.26 |
| 6,889,755 B2* | 5/2005 | Zuo et al. | 165/104.26 |
| 6,955,062 B2* | 10/2005 | Tilton et al. | 62/259.2 |
| 6,955,063 B2* | 10/2005 | Adiga et al. | 62/259.2 |
| 7,362,574 B2* | 4/2008 | Campbell et al. | 361/699 |
| 7,450,381 B2* | 11/2008 | Gilliland et al. | 361/695 |
| 7,610,769 B2* | 11/2009 | Tain et al. | 62/259.2 |
| 7,626,483 B2* | 12/2009 | Ohtsuka et al. | 337/167 |
| 8,037,926 B2* | 10/2011 | Martin et al. | 165/80.4 |
| 8,051,905 B2* | 11/2011 | Arik et al. | 165/287 |
| 8,235,096 B1* | 8/2012 | Mahefkey et al. | 165/104.26 |
| 8,299,887 B2* | 10/2012 | Ohtsuka et al. | 337/167 |
| 2003/0048619 A1* | 3/2003 | Kaler et al. | 361/760 |
| 2005/0063875 A1* | 3/2005 | Schatz et al. | 422/100 |
| 2005/0135061 A1* | 6/2005 | Kiley | 361/700 |
| 2005/0135062 A1* | 6/2005 | Kiley et al. | 361/700 |
| 2005/0211427 A1* | 9/2005 | Kenny et al. | 165/299 |
| 2006/0134799 A1* | 6/2006 | Sharma et al. | 436/174 |
| 2006/0157223 A1* | 7/2006 | Gelorme et al. | 165/80.3 |
| 2007/0085054 A1* | 4/2007 | Lin | 252/70 |
| 2007/0119573 A1* | 5/2007 | Mahalingam et al. | 165/80.4 |
| 2008/0013281 A1* | 1/2008 | Ouyang | 361/707 |
| 2008/0043440 A1* | 2/2008 | Fedorov | 361/700 |
| 2008/0105829 A1* | 5/2008 | Faris et al. | 250/432 R |
| 2008/0137316 A1* | 6/2008 | Khaselev et al. | 361/772 |
| 2008/0237843 A1* | 10/2008 | Gupta et al. | 257/713 |
| 2008/0266766 A1* | 10/2008 | D'Urso et al. | 361/681 |
| 2009/0040716 A1* | 2/2009 | Fedorov | 361/694 |
| 2009/0050294 A1* | 2/2009 | Fedorov | 165/80.3 |
| 2010/0254088 A1* | 10/2010 | Ishida et al. | 361/700 |
| 2010/0314093 A1* | 12/2010 | Refai-Ahmed et al. | 165/287 |
| 2012/0279068 A1* | 11/2012 | Mahefkey et al. | 29/890.032 |

OTHER PUBLICATIONS

Valentino, Joseph P., et al., "Thermocapillary actuation of liquids using patterned microheater arrays," Technical Digest, 12th International Conference on Solid State Sensors, Actuators and Microsystems, Jun. 8-12, 2003, pp. 667-669.

* cited by examiner

US 8,953,314 B1

PASSIVE HEAT SINK FOR DYNAMIC THERMAL MANAGEMENT OF HOT SPOTS

RELATED APPLICATIONS

This application claims the benefit of provisional patent application Ser. No. 61/371,891, filed Aug. 9, 2010, the disclosure of which is hereby incorporated herein by reference in its entirety.

GOVERNMENTAL RIGHTS

This invention was made with government support under HR0011-10-3-0002 awarded by DARPA. The Government has certain rights in the invention.

FIELD OF THE DISCLOSURE

The present disclosure relates to a cooling system for a microelectronic device.

BACKGROUND

In the course of the past few years, the problem of removing heat resulting from the operation of microelectronic devices has elevated from being an important concern to becoming a widely recognized bottleneck limiting further progress of high performance microelectronic devices. Excessive heating affects not only performance, but also reliability. With continuing increase in integration levels and introduction of new 3-D chip and interconnect architectures, the challenge to cool microelectronic devices has become even more difficult.

As an example, traditional single core microprocessors generate a significant amount of heat, which is typically in the range of 20-50 Watts per square centimeter ($W/cm^2$). However, modern multi-core microprocessors result in significantly more heat. Multi-core microprocessors experience a global or uniform heat flux that is typically on the order of 20-50 $W/cm^2$. In addition, multi-core microprocessors experience hot spots resulting from the active cores that are typically in the range of 2 to 10 times greater than the global heat flux (i.e., as much as 500 to 1000 $W/cm^2$). Further compounding the issue, the number of cores that are active at any one time and the specific cores that are active at any one time dynamically changes. As a result of the activation and deactivation of the cores, the hot spots are dynamically moving. The heat issue in multi-core microprocessors is even further compounded by 3-D architectures that utilize stacks of multiple active layers (i.e., multiple layers of active cores).

The traditional approach to remove heat from microelectronic devices is not sufficient to alleviate the dynamically moving hot spots generated in multi-core microprocessors. For example, a traditional heat sink has to target the largest heat flux (i.e., worst case) produced at the hot spots and be able to dissipate such a large flux over the entire semiconductor die on which the microprocessor is formed. Thus, if the multi-core microprocessor is formed on a 1 $cm^2$ die with 10 layers and the worst case hot spot is 1000 $W/cm^2$, then the heat sink would be required to remove 10 kilowatts (kW) of heat (i.e., 1000 $W/cm^2 \times 10$ layers$\times 1$ $cm^2$). This is not possible using conventional technology. As such, there is a need for a cooling system for microelectronic devices such as, but not limited to, multi-core microprocessors that have dynamically moving hot spots and, in some cases, multiple active layers.

SUMMARY

The present disclosure relates to a fully-passive, dynamically configurable directed cooling system for a microelectronic device. In general, movable pins are suspended within a cooling plenum between an active layer and a second layer of the microelectronic device. In one embodiment, the second layer is another active layer of the microelectronic device. The movable pins are formed of a material that has a surface tension that decreases as temperature increases. Due to the Marangoni effect, or capillary flow, the movable pins preferentially move in directions of increasing surface tension. Since the movable pins have a surface tension that decreases as temperature increases, the movable pins move in directions of decreasing temperature on the surface of the active layer.

By moving in the direction of decreasing temperature, the movable pins move to areas on the surface of the active layer that are cool (i.e., where the movable pins have the highest surface tension) and away from areas on the surface of the active layer that are hot (i.e., where the movable pins have the lowest surface tension). In this manner, the movable pins open a pathway for preferential flow of a coolant through the cooling plenum at a higher flow rate towards areas, or domains, of the active layer that need higher heat dissipation (i.e., hot spots) and bypassing the cool areas, or domains, that do not need cooling at a given instance of time. Further, in one embodiment, the hot spots in the active layers dynamically move over time. In response, the movable pins dynamically reconfigure in a fully passive manner, i.e., without use of any external means.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
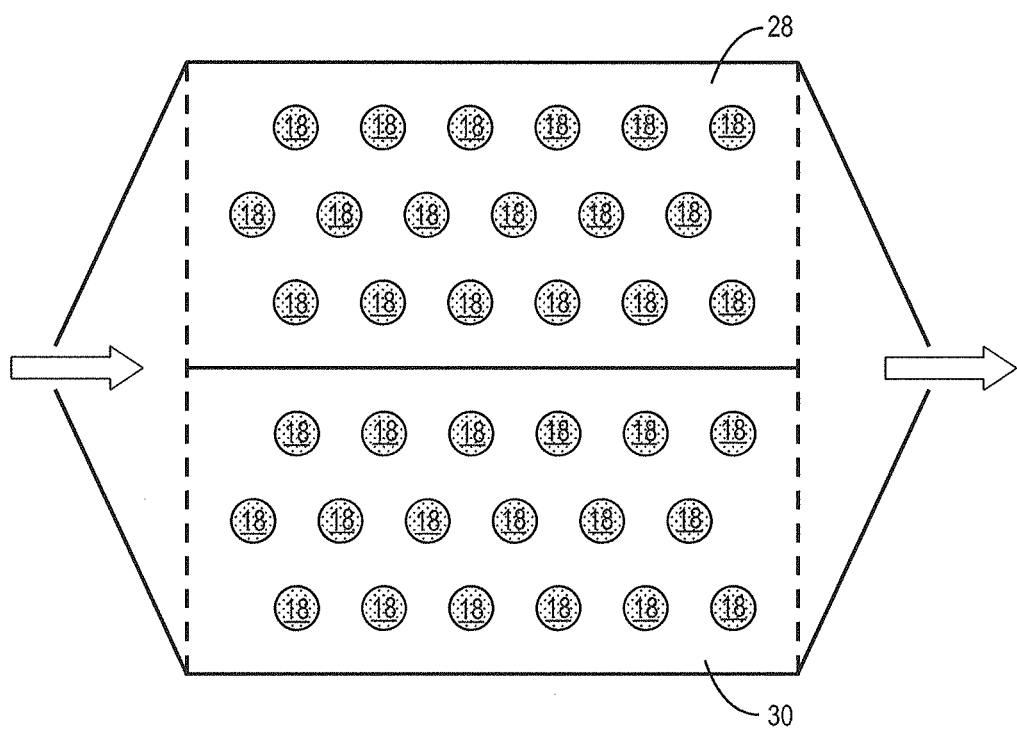
Figure 4:
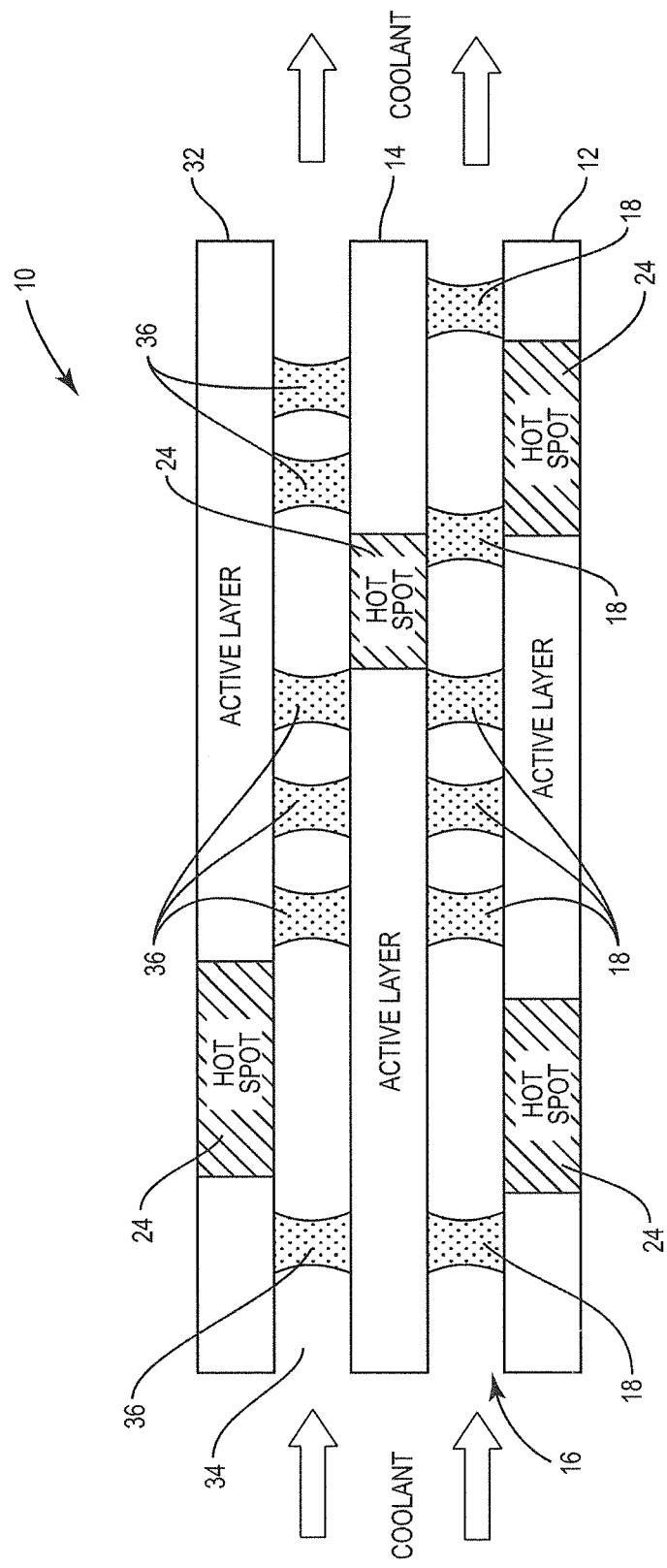

FIGS. 1A through 1D illustrate a fully-passive, dynamically reconfigurable directed cooling system according to one embodiment of the present disclosure;

FIGS. 2A through 2E graphically illustrate a process for fabricating a microelectronic device including a fully-passive, dynamically reconfigurable directed cooling system according to one embodiment of the present disclosure;

FIG. 3 illustrates a multi-domain cooling plenum according to one embodiment of the present disclosure; and FIG. 4 illustrates a microelectronic device having multiple stacked active layers and multiple cooling plenums according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

FIGS. 1A through 1D illustrate a microelectronic device 10 including a fully-passive, dynamically configurable directed cooling system according to one embodiment of the present disclosure. As illustrated in FIG. 1A, the microelectronic device 10 includes two active layers 12 and 14, a cooling plenum 16 between the active layers 12 and 14, and a number of droplets suspended within the cooling plenum 16 between the active layers 12 and 14 to form movable pins 18. The active layers 12 and 14 are layers in which active components of the microelectronic device 10 are formed. For instance, in one embodiment, the microelectronic device 10 is a multi-core microprocessor, and each of the active layers 12 and 14 includes one or more cores of the multi-core microprocessor. A coolant flows through the cooling plenum 16 and is directed by the movable pins 18. The coolant may be any desired coolant that is suitable for flowing through the cooling plenum 16. For instance, the coolant may be air or water, but is not limited thereto. As discussed below, the movable pins 18 move within the cooling plenum 16 in such a manner that the coolant is directed to areas of the active layers 12 and 14 that need cooling, which are referred to herein as hot spots.

In one embodiment, the movable pins 18 are liquid droplets formed of a liquid material having a high thermal conductivity and a surface tension that decreases with temperature (i.e., a negative surface tension temperature coefficient). As discussed below in detail, some exemplary liquid materials that may be used to form the movable pins 18 are: Gallium or Gallium-based Indium-Tin (InPb) alloys, surfactant-stabilized deionized (DI) water, other Gallium-based alloys doped with Indium and Tin (e.g., commercially-manufactured Galinstan alloy with composition 68.5% Ga21.5% In10% Sn), or low-melting temperature solders which can be doped with Gallium. In another embodiment, the movable pins 18 are droplets formed of a composite material including a solid core surrounded by a liquid shell. Preferably, the solid core is material having high thermal conductivity, and the liquid shell is a liquid material having a surface tension that decreases with temperature (i.e., a negative surface tension temperature coefficient). Some exemplary non-limiting materials that may be used for the solid core are Copper, Silver, Aluminum, and Carbon Nanotube (CNT) bundles/diamonds.

In one embodiment, as used herein, a material having a "high thermal conductivity" is a material having a thermal conductivity in a range of or including 1 to 2000 Watts per meters-Kelvin (W/mK). In another embodiment, a material having a "high thermal conductivity" is a material having a thermal conductivity in a range of and including 10 to 500 W/mK. Further, in one embodiment, the surface tension temperature coefficient of the material of which the movable pins 18 are formed is in a range of and including approximately −0.7 to −0.01 milli-Newtons per meters-Kelvin (mN/mK) (or even lower). In another embodiment, the surface tension temperature coefficient of the material of which the movable pins 18 are formed is in a range of and including approximately −0.7 to −0.1 mN/mK. Note that the ranges for high thermal conductivity and negative surface tension temperature coefficient given above are exemplary and are not intended to limit the scope of the present disclosure.

A density of material used to form the movable pins 18 is preferably approximately equal to or greater than the density of the coolant. For example, if the coolant is air with the density of ~1 kilogram per cubic meter (kg/m$^3$), then the density of the material used to form the movable pins 18 is, in one embodiment, at least 2 or 3 times that of air or, in another embodiment, in a range of 1 to 10 kg/m$^3$. If the coolant is water with a density of ~1000 kg/m3, then the density of the material used to form the movable pins 18 is, in one embodiment, 2 to 3 times greater than that of water (i.e., approximately 2000 to 3000 kg/m$^3$). Essentially, the density of the material used to form the movable pins 18 is a trade-off between response time (i.e., how quickly and easily the movable pins 18 will move in response to the temperature gradient by capillary forces due to less inertia) and having sufficient density to not be swept away by the coolant.

By utilizing the Marangoni effect, the movable pins 18 preferentially move within the cooling plenum 16 in directions of increasing surface tension, where surface tension is a function of temperature. Since the movable pins 18 have a surface tension that decreases as temperature increases, due to the Marangoni effect, the movable pins 18 move to areas on the surfaces of the active layers 12 and 14 that are cool (i.e., where the movable pins 18 have the highest surface tension) and away from areas on the surfaces of the active layers 12 and 14 that are hot (i.e., where the movable pins 18 have the lowest surface tension). The movement of the movable pins 18 according to the Marangoni effect is also referred to herein as capillary flow. In this manner, the movable pins 18 open a pathway for preferential flow of the coolant through the cooling plenum 16 at a higher flow rate towards areas, or domains, of the active layers 12 and 14 that need higher heat dissipation, which are referred to herein as hot spots, and bypassing the cool areas, or domains, of the active layers 12 and 14 that do not need cooling at a given instance of time. Further, in one embodiment, the hot spots in the active layers 12 and 14 dynamically move over time. In response, the movable pins 18 dynamically reconfigure in a fully passive manner.

Notably, the movable pins 18 are formed such that they do not coalesce. More specifically, in one embodiment, a surfactant is used to prevent the droplets forming the movable pins 18 from coalescing. In another embodiment, the droplets forming the movable pins 18 are electrically charged of the same sign (e.g., all positively charged). Because they are electrically charged of the same sign, the movable pins 18 repel one another, which prevents the movable pins 18 from coalescing.

Figure 1B:
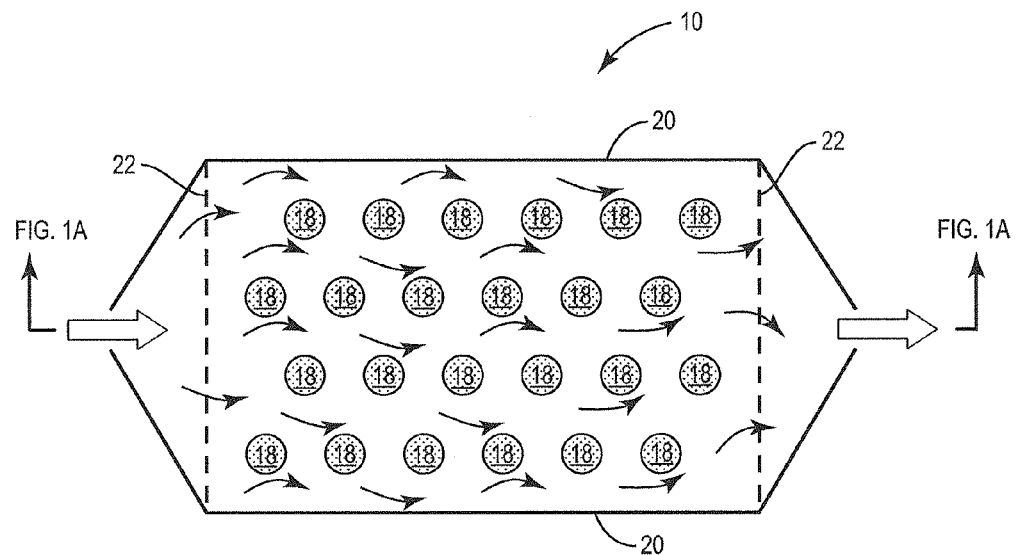

FIG. 1B is a top down view of the microelectronic device 10 of FIG. 1A showing the movable pins 18 within the cooling plenum 16. In FIG. 1B, the movable pins 18 are illustrated as being uniformly distributed within the cooling plenum 16. This occurs when a uniform temperature is present across the surfaces of the active layers 12 and 14. As a result, coolant flowing through the cooling plenum 16 provides uniform heat dissipation over the entire surfaces of the active layers 12 and 14. FIG. 1B also illustrates walls 20 of the cooling plenum 16 and a mesh 22 at openings in the cooling plenum 16 through which the coolant flows. The walls 20 and the mesh 22 confine the movable pins 18 to the cooling plenum 16. Notably, openings in the mesh 22 are sized such that they are large enough to allow coolant (e.g., air or water) to flow through the mesh 22 into and out of the cooling plenum 16 but small enough to confine the movable pins 18 inside the cooling plenum 16. The exact sizing of the openings in the mesh 22 depends on the particular embodiment (e.g., the size of the droplets forming the movable pins 18, the type of coolant used, etc.). Further, in the embodiment where the movable pins 18 are electrically charged, the mesh 22 may also be electrically charged of the same sign.

The size of the movable pins 18 is, in one embodiment, on the order of magnitude of a typical hot spot. In the case of a multi-core microprocessor, the size of the movable pins 18 may be as large as a core of the multi-core microprocessor. In one particular embodiment, the size, or diameter, of each of the movable pins 18 is in a range of and including 100 nanometers (nm) to 1 millimeter (mm). In another embodiment, the size, or diameter, of each of the movable pins 18 is in a range of and including 10 to 100 micrometer (μm). Note, however, that these sizes are exemplary and are not intended to limit the scope of the present disclosure. Further, the particular size of the movable pins 18 used for a particular application may be decided based on a trade-off between the flexibility of the cooling system resulting from the use of a larger number of smaller movable pins 18 (e.g., the smaller the movable pins 18 are, then the more movable pins 18 that can be put in the cooling plenum 16, which in turn increases the number of optimum pin configurations that can be attained with a faster response time) and the reduced complexity and cost resulting from using a smaller number of larger movable pins 18. Also, when uniformly distributed as shown in FIG. 1B, the spacing between the movable pins 18 (i.e., the lateral distance between the movable pins 18) is, in one embodiment, in a range of and including 1 to 100 µm. However, the present disclosure is not limited thereto. The lateral distance between the movable pins 18 when uniformly distributed may vary depending on the particular application.

Gallium added in quantities up to 2% in common solders aids significantly in their wetting and flow characteristics. In another embodiment, the movable pins 18 are droplets of a composite material where each of the movable pins 18 includes a solid core of a material having a high thermal conductivity (e.g., Copper, Silver, Aluminum, and CNT bundles/diamonds) and a liquid shell surrounding the solid core of a liquid material having a surface tension that decreases with increasing temperature. Relevant properties of three representative materials are summarized in Table 1, and are used below to describe performance characteristics of the disclosed cooling system. Note, however, as will be appreciated by one of ordinary skill in the art upon reading this disclosure, the materials discussed herein for the movable pins 18 are exemplary. Other types of liquid or composite materials having high thermal conductivity and a surface tension that decreases as temperature increases may be used.

TABLE 1

Relevant properties of exemplary substances for movable pins

|  | Melting Point (° C. at 1 atm) | Boiling Point (° C. at 1 atm) | Density (kg/m³ at 20° C.) | Viscosity (Pa * s at 20° C.) | Thermal Conductivity (W/mK at 20° C.) | Surface Tension (mN/m as f (T in ° C.)) |
|---|---|---|---|---|---|---|
| Gallium | 29.8 | 2204 | 6095 | ~0.002 (at MP) | 40 | ~708 − 0.66 * (T − 29.8) |
| Galinstan Alloy (68.5%Ga21.5%In10%Sn) | −19 | >1300 | 6440 | 0.0024 | 16.5 | ~718 − 0.66 * (T − 29.8) |
| Water (for comparison) | 0 | 100 | 1000 | 0.001 | 0.609 | 75 − 0.17 * T |

Figure 1C:
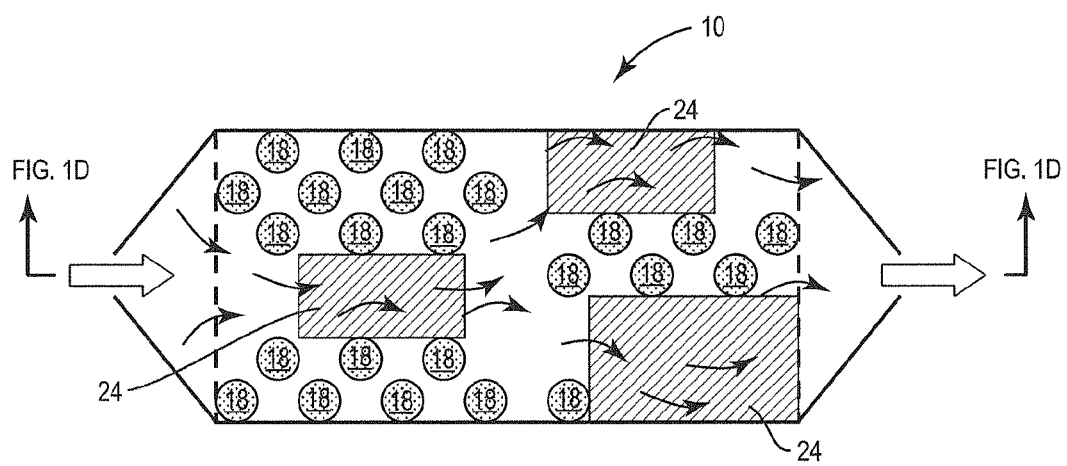
Figure 1D:
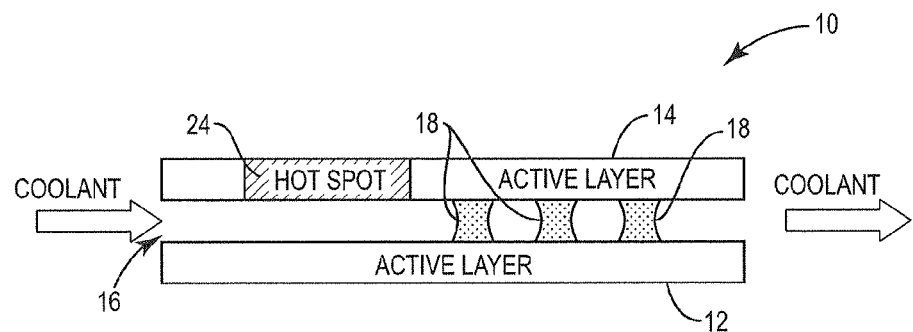

FIG. 1C is a top down view of the microelectronic device 10 of FIG. 1A illustrating the dynamic re-configuration of the movable pins 18 in response to hot spots 24 in the active layers 12 and 14. Specifically, the hot spots 24 create a temperature gradient over the surfaces of the active layers 12 and 14. This temperature gradient induces movement of the movable pins 18 in directions of decreasing temperature. As a result, as shown in FIG. 1C, the movable pins 18 migrate to cool areas on the surfaces of the active layers 12 and 14 away from the hot spots 24. This opens a pathway for preferential flow of the coolant within the cooling plenum 16 at a higher flow rate towards the hot spots 24 and bypassing the cooler areas. Notably, as the hot spots 24 move, so too do the movable pins 18. FIG. 1D is a cross-sectional view of FIG. 1C showing the large opening created by the movable pins 18 for one of the hot spots 24 to direct the coolant to the hot spot 24.

In one embodiment, the movable pins 18 are liquid droplets of Gallium or Gallium-based InPb alloys, in which case the coolant may be, for example, air or water. In another embodiment, the movable pins 18 are liquid droplets of surfactant-stabilized DI water, in which case the coolant may be, for example, air. Some other liquid substances that may be used for the movable pins 18 include, but are not limited to: (i) other Gallium-based alloys doped with Indium and Tin that can be used to tune the melting point, viscosity, thermal conductivity, and surface tension (e.g., commercially-manufactured Galinstan alloy with composition 68.5% Ga21.5% In10% Sn); and (ii) low-melting temperature solders which can be doped with Gallium to modify their properties towards greater substrate wettability with strong temperature dependence of the surface tension and improved fluidity. In fact, High surface wettability (i.e., contact angle approaching zero) of the material used for the movable pins 18 to the surfaces of the active layers 12 and 14 is one desired property. Preferably, the wettability is such that a contact angle between the movable pins 18 and the surfaces of the active layers 12 and 14 is between 0 and 90 degrees. High surface wettability increases a contact area between the movable pins 18 and the surfaces of the active layers 12 and 14, thereby providing high capillary coupling between the movable pins 18 and the active layers 12 and 14. The high capillary coupling supports significant capillary or interfacial forces to the movable pins 18 resulting in fast movement of the movable pins 18 in response to a temperature gradient.

Gallium and Gallium-based alloys are highly wettable (i.e., have a contact angle approaching zero) to most substrate materials, including Silicon dioxide ($SiO_2$) which is commonly used as a dielectric passivation layer for electrical insulation between the active layers (e.g., the active layers 12 and 14) in the stacked-die forming the microelectronic device 10. Silicon dioxide is also wettable by water with the contact angle between 0 and 90°, depending on the oxide thickness. This means that the capillary coupling between the movable pins 18 when made of either Ga/Ga-based alloys or water and the $SiO_2$ substrate will be strong to support application of significant capillary forces to the movable pins 18 resulting in their fast motion in response to the temperature gradient.

It should be noted that at near-room temperatures (in the range of expected application of electronic components) Gallium and Gallium-based InPb-alloys (e.g., Galinstan) are neither toxic nor reactive towards air and water due to the formation of a passive, protective oxide layer. Further, Gallium and its InPb-doped alloys are insoluble in water or organic solvents. Therefore, a wide range of fluids, including water, organic liquids, and air could be used as coolants in conjunction with the movable pins 18 when formed of Gallium or Gallium-alloy liquid droplets. It should also be noted that Galinstan and other Gallium and Gallium-based InPb-alloys are commercially available materials.

The speed of the capillary motion (i.e., the speed of the movement of the movable pins 18) corresponds to the response time of the cooling system described herein. The speed of the capillary motion is proportional to the temperature coefficient in the surface tension temperature-dependence $\partial\gamma/\partial T$ (see Table 1), the magnitude of the temperature gradient $\nabla T$ driving capillary flow in the direction of increased surface tension (i.e., towards lower temperatures for liquids with a negative surface tension temperature coefficient), the vertical height h of the movable pins 18 defined by a gap size of the cooling plenum 16 (i.e., a distance between the active layers 12 and 14), and inversely proportional to the liquid viscosity $\mu$. For the capillary motion of liquid films, which can be used as an approximation for the movable pins 18, an experimentally-verified expression exists to predict the speed of capillary motion: $V \approx 0.5 \times h \times \partial\gamma/\partial T \times \nabla T \times \mu^{-1}$. Note that this expression is for a liquid in contact at one side only with a substrate, and the velocity would double for the movable pins 18 which are confined between and interacting with two substrates of the cooling plenum 16 (i.e., the two active layers 12 and 14).

For example, if the cooling plenum 16 has a thickness of 100 μm and a temperature gradient of $10^5$ degrees Celsius per meter (° C./m) (corresponding to 10° C. temperature drop across the 100 μm distance, which is quite typical for hot spots) is imposed within the cooling plenum 16, the resulting motion of the movable pins 18 would occur at approximately 2.8 meters per second (m/s) if the movable pins 18 are formed of Galinstan and approximately 1.7 m/s if the movable pins 18 are formed of water. This translates into a response time for rearrangement of the movable pins 18 (i.e., time to move the movable pins 18 to new positions from the hot to the cold zone on the substrate, ~distance/velocity) of approximately 0.03 milliseconds for Galinstan and approximately 0.06 milliseconds for water. While this analysis does not account for intra-droplet interactions due to collective motion and inertial effects (proportional to the material density of the material used for the movable pins 18), these effects are expected to have minimal impact due to a very small size of the movable pins 18 and therefore strong dominance of surface-vs-bulk transport processes. Thus, this analysis provides a good first-order approximation for the transient response of the disclosed cooling system, which is impressive and responsive to expected dynamics of hot spot migration (~sub-millisecond) in microprocessors. It should be noted that if the temperature gradient is increased by an order of magnitude, the capillary velocities would increase by the same order of magnitude, while the time response of the cooling scheme (re-arrangement of the movable pins 18) would decrease by two orders of magnitude, leading to an unprecedented sub-microsecond response of the cooling system.

Figure 2A:
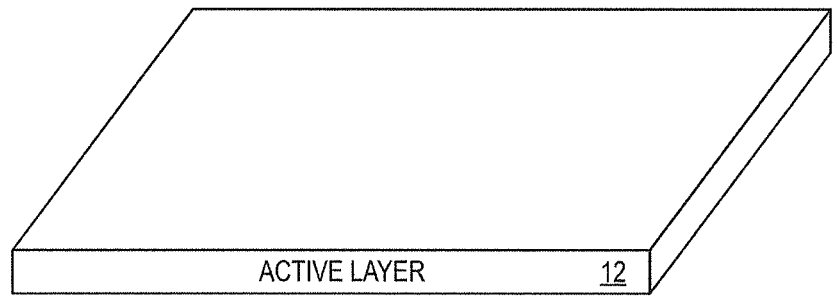
Figure 2B:
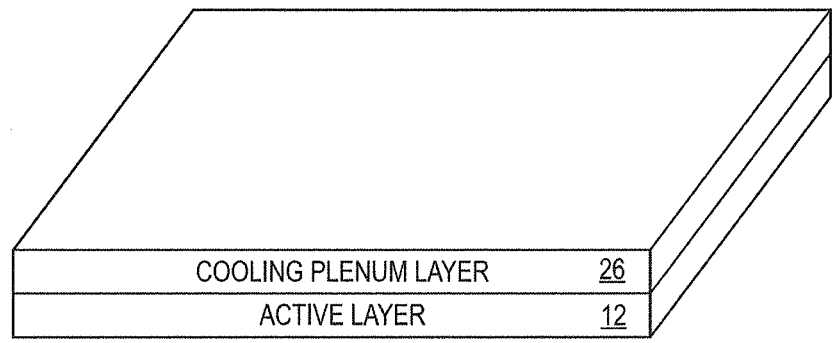
Figure 2C:
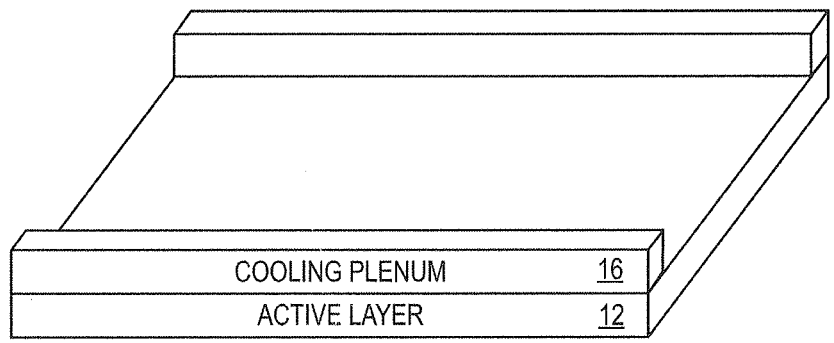
Figure 2D:
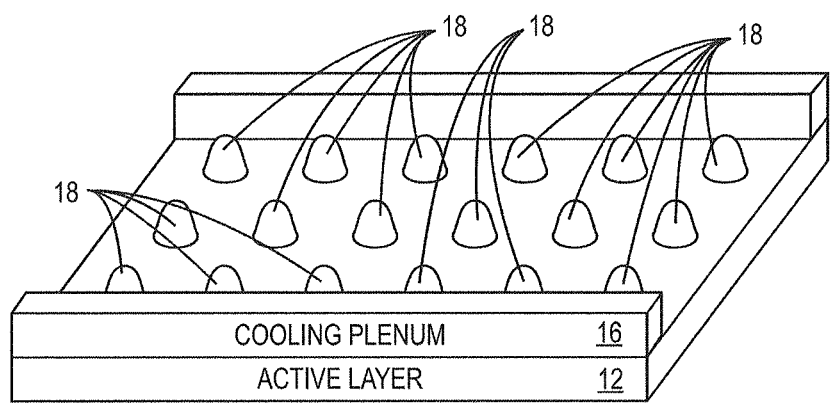
Figure 2E:
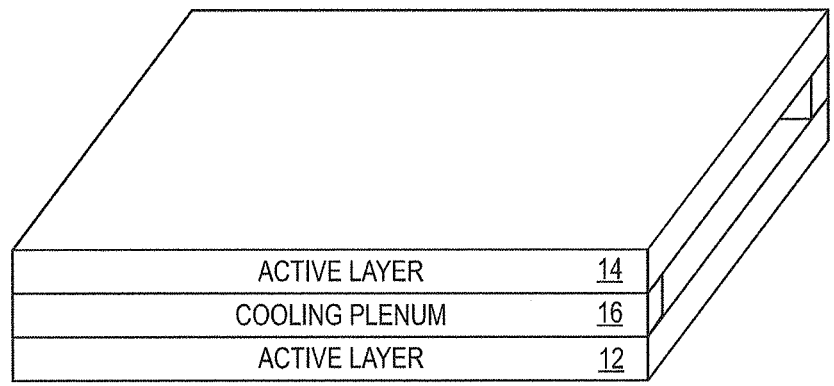

FIGS. 2A through 2E graphically illustrate a process for forming the microelectronic device 10 of FIGS. 1A through 1D according to one embodiment of the present disclosure. As illustrated in FIG. 2A, the process begins with the active layer 12. Then, as illustrated in FIG. 2B, a cooling plenum layer 26 is provided on the active layer 12. The cooling plenum layer 26 may be formed of any suitable material such as, for example, a dielectric or insulation material such as, for example, $SiO_2$, a polymer, or the like. Next, the cooling plenum layer 26 is etched or otherwise processed to form the cooling plenum 16, as illustrated in FIG. 2C. The liquid droplets, or movable pins 18, are then provided in the cooling plenum 16, as illustrated in FIG. 2D. Notably, the manner in which the liquid droplets are formed and deposited is well known in the art. Any conventional technique may be used, including ultrasonic or electrostatic dispersion, ink-jet printing, and others. Lastly, the active layer 14 is provided over the cooling plenum 16, as illustrated in FIG. 2E. As this point, the liquid droplets are suspended between the two active layers 12 and 14 as the movable pins 18. While not shown, the mesh 22 is provided over the openings at each end of the cooling plenum 16 (see FIGS. 1B and 1C).

FIG. 3 illustrates another embodiment of the cooling plenum 16. In this embodiment, the cooling plenum 16 includes multiple domains, or sectors, 28 and 30. Note that while two domains are illustrated, the cooling plenum 16 may include any number of one or more domains. Further, the domains may be of different sizes and/or shapes. Each of the domains 28 and 30 includes movable pins 18. The movable pins 18 in the domain 28 are constrained to the domain 28. Likewise, the movable pins 18 in the domain 30 are constrained to the domain 30. As discussed above, the movable pins 18 move away from hot spots to provide directed flow of the coolant to the hot spots. Size, number, and material of the movable pins 18 in the domains 28 and 30 may be different depending on specific cooling requirements of each of the domains 28 and 30.

FIG. 4 illustrates another embodiment of the microelectronic device 10 where the microelectronic device 10 includes multiple active layers and cooling plenums. Specifically, in this embodiment, the microelectronic device 10 includes the active layers 12 and 14 as well as an additional active layer 32. The microelectronic device 10 includes the cooling plenum 16 between the active layers 12 and 14 and another cooling plenum 34 between the active layers 14 and 32. The cooling plenum 34 includes droplets suspended between the active layers 14 and 32 that form movable pins 36 in the same manner described above with respect to the movable pins 18. In this manner, the cooling system described herein may be extended to microelectronic devices having any number of stacked layers.

It should be noted that while the cooling plenum (e.g., the cooling plenum 16) and movable pins (e.g., the movable pins 18) are described herein as being implemented between two active layers (e.g., the active layers 12 and 14), the present disclosure is not limited thereto. For example, a cooling plenum may be provided between an active layer and a non-active layer (e.g., an $SiO_2$ layer). As another example, a single active layer may be between two cooling plenums (e.g., a cooling plenum and a non-active layer on both the top and bottom surfaces of the single active layer).

Some exemplary and non-limiting benefits of the cooling system described herein are as follows. The cooling system is fully passive and dynamically reconfigurable (i.e., adaptive). As the hot spots on the surfaces of the active layers 12 and 14 (and 32) move due to, for example, activation and deactivation of the cores of a multi-core microprocessor, the movable pins 18 (and 36) re-configure to direct coolant flow to the hot spots. This is done in a fully-passive manner without the need for any active control system, which in turn reduces packaging complexity and cost and improves reliability. Further, the cooling system described herein is universal and can work with different coolants ranging from air to liquids depending on the specific power dissipation profile of a given application of a microelectronic device. Also, the form factor of the cooling system which is composed of a small-gap cooling plenum confining movable pins is fully compatible with architectural features of a 3-D stacked die, thus providing the possibility of a chip-level "drop-in" solution for any number of active layers, possibly on an as-needed basis depending on a specific power profile for each active layer. Lastly, the cooling system minimizes power consumption (cooling overhead) as coolant is not pumped over the cool areas of the active layers such that only the hot spots are cooled.

Those skilled in the art will recognize improvements and modifications to the preferred embodiments of the present disclosure. All such improvements and modifications are considered within the scope of the concepts disclosed herein and the claims that follow.

What is claimed is:

1. A microelectronic device comprising:
   an active layer;
   a cooling plenum on a surface of the active layer;
   a second layer on the cooling plenum opposite the active layer such that the cooling plenum is between the active layer and the second layer; and
   a plurality of movable pins suspended in the cooling plenum between the active layer and the second layer, the plurality of movable pins being formed of a material having a surface tension that decreases as temperature increases such that, in response to a temperature gradient on the surface of the active layer, the plurality of movable pins move by capillary flow in directions of decreasing temperature on the surface of the active layer.

2. The microelectronic device of claim 1 wherein the plurality of movable pins move away from one or more hot spots on the surface of the active layer.

3. The microelectronic device of claim 1 wherein the plurality of movable pins direct flow of a coolant through the cooling plenum to one or more hot spots on the surface of the active layer.

4. The microelectronic device of claim 1 wherein movement of the plurality of movable pins is fully passive.

5. The microelectronic device of claim 1 wherein the plurality of movable pins are dynamically re-configurable in response to changes in the temperature gradient on the surface of the active layer.

6. The microelectronic device of claim 1 wherein the material of which the plurality of movable pins are formed has a negative surface tension temperature coefficient.

7. The microelectronic device of claim 6 wherein the negative surface tension temperature coefficient is in a range of and including −0.7 mN/mK to −0.01 mN/mK.

8. The microelectronic device of claim 6 wherein the negative surface tension temperature coefficient is in a range of and including −0.7 mN/mK to −0.1 mN/mK.

9. The microelectronic device of claim 1 wherein the material of which the plurality of movable pins are formed has a high thermal conductivity.

10. The microelectronic device of claim 9 wherein the high thermal conductivity is in a range of and including 1 to 2000 W/mK.

11. The microelectronic device of claim 9 wherein the high thermal conductivity is in a range of and including 10 to 500 W/mK.

12. The microelectronic device of claim 1 wherein a contact angle between each of the plurality of movable pins and the surface of the active layer is in a range of 0 to 90 degrees.

13. The microelectronic device of claim 1 wherein the plurality of movable pins have a sub-millisecond response time to changes in the temperature gradient on the surface of the active layer.

14. The microelectronic device of claim 1 wherein the plurality of movable pins is a plurality of liquid droplets formed of a liquid material having a surface tension that decreases as temperature increases such that, in response to the temperature gradient on the surface of the active layer, the plurality of movable pins move by capillary flow in directions of decreasing temperature on the surface of the active layer.

15. The microelectronic device of claim 14 wherein the liquid material is gallium.

16. The microelectronic device of claim 14 wherein the liquid material is a gallium based indium-tin (InPb) alloy.

17. The microelectronic device of claim 14 wherein the liquid material is gallium based alloy doped with indium and tin.

18. The microelectronic device of claim 14 wherein the liquid material is galinstan.

19. The microelectronic device of claim 14 wherein the liquid material is water.

20. The microelectronic device of claim 14 wherein the liquid material is surfactant-stabilized deionized (DI) water.

21. The microelectronic device of claim 14 wherein the liquid material is solder with up to 2% gallium.

22. The microelectronic device of claim 1 wherein the plurality of movable pins is a plurality of droplets of a composite material such that each of the plurality of movable pins has a solid core and a liquid shell surrounding the solid core, the liquid shell being formed of a liquid material having a surface tension that decreases as temperature increases such that, in response to the temperature gradient on the surface of the active layer, the plurality of movable pins move by capillary flow in directions of decreasing temperature on the surface of the active layer.

23. The microelectronic device of claim 22 wherein the solid core is formed of a material having a high thermal conductivity.

24. The microelectronic device of claim 23 wherein the high thermal conductivity is in a range of and including 1 to 2000 W/mK.

25. The microelectronic device of claim 23 wherein the high thermal conductivity is in a range of and including 10 to 500 W/mK.

26. The microelectronic device of claim 23 wherein the liquid shell surrounding the solid core provides a contact angle with the surface of the active layer in a range of and including 0 to 90 degrees.

27. The microelectronic device of claim 1 wherein a surfactant is utilized to prevent the plurality of movable pins from coalescing.

28. The microelectronic device of claim 1 wherein the plurality of movable pins are electrically charged of a same sign.

29. The microelectronic device of claim 1 wherein a density of the material of which the plurality of movable pins are formed is approximately equal to or greater than a density of a coolant that flows through the cooling plenum.

30. The microelectronic device of claim 1 wherein, when a uniform temperature is provided across the surface of the active layer, a lateral distance between the plurality of movable pins is in a range of and including 1 to 100 micrometers.

31. The microelectronic device of claim 1 wherein each of the plurality of movable pins has a diameter in a range of and including 100 nanometers to 1 millimeter.

32. The microelectronic device of claim 1 wherein each of the plurality of movable pins has a diameter in a range of and including 10 to 100 micrometers.

33. The microelectronic device of claim 1 wherein the second layer is a second active layer.

34. The microelectronic device of claim 1 wherein the cooling plenum comprises a plurality of domains.

35. The microelectronic device of claim 1 further comprising:
- a plurality of active layers, including the active layer and the second layer, that are stacked; and
- a plurality of cooling plenums including the cooling plenum, each cooling plenum of the plurality of cooling plenums being between a corresponding pair of the plurality of active layers; and
- for each cooling plenum of the plurality of cooling plenums, a plurality of movable pins suspended in the cooling plenum between the corresponding pair of the plurality of active layers, the plurality of movable pins being formed of a material having a surface tension that decreases as temperature increases such that, in response to a temperature gradient on corresponding surfaces of the corresponding pair of the plurality of active layers, the plurality of movable pins move by capillary flow in directions of decreasing temperature on the corresponding surfaces of the corresponding pair of the plurality of active layers.

\* \* \* \* \*